(12) United States Patent
Vu

(10) Patent No.: US 11,199,445 B1
(45) Date of Patent: Dec. 14, 2021

(54) AMBIENT LIGHT AND NOISE CANCELLING DEVICE

(71) Applicant: OSRAM Opto Semiconductors GmbH, Regensburg (DE)

(72) Inventor: Hoa Vu, Milpitas, CA (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 17/066,489

(22) Filed: Oct. 9, 2020

(51) Int. Cl.
  *G01J 1/44* (2006.01)
  *H01L 31/02* (2006.01)
  *G01S 7/4861* (2020.01)

(52) U.S. Cl.
  CPC .............. *G01J 1/44* (2013.01); *G01S 7/4861* (2013.01); *H01L 31/02019* (2013.01); *G01J 2001/444* (2013.01); *G01J 2001/446* (2013.01)

(58) Field of Classification Search
  CPC .. G01N 15/1434; G01N 21/274; G01N 25/72; H01L 27/14643; H01L 27/14806; H04N 5/357; H04N 5/3658; G01J 1/44; G01J 11/00; G01J 1/16; G01J 1/4204; G01J 1/4228; G01S 13/06; G01S 7/41; G01S 7/493
  USPC .......................................... 250/214 AL, 214 R
  See application file for complete search history.

(56) References Cited

U.S. PATENT DOCUMENTS 9,232,163 B2 *    1/2016    Fossum ................ H04N 5/3745

* cited by examiner

*Primary Examiner* — Que Tan Le
(74) *Attorney, Agent, or Firm* — Viering, Jentschura & Partner mbB

(57) ABSTRACT

A device for cancelling undesired fractions in a detected signal may include a first region having an output node and including a light sensitive sensor configured to detect a first signal and an analogue to digital converter coupled to the output node. A second region may be switchably coupled to the first region based on a first control signal to the first region. The second region may include a storage device configured to store a signal based on the detection of the first signal. The second region may include an output node coupled to the sensor. The second may be configured to provide a compensation signal based on the stored signal to the light sensitive sensor during detection of a second signal.

14 Claims, 3 Drawing Sheets

AMBIENT LIGHT AND NOISE CANCELLING DEVICE

TECHNICAL FIELD

The present invention relates to a noise-cancelling device or more generally to a device configured for cancelling undesired signal fractions in a detected signal and to a method for cancelling undesired signal fractions in a detected signal.

BACKGROUND

In some instances, light is detected by a light sensitive sensor and subsequently evaluated. Processing the signal is often performed in the digital domain and therefore any detected signal needs to be converted. This is relevant for when light is detected, and whenever sensing and detecting a signal may be necessary.

The conversion from the analogue domain, in which the signal is detected into the digital domain, requires an analogue to digital converter. In some instances however, the detected signal is not free of unwanted and undesired signal fractions. Rather these undesired signal fractions can sometimes be in the range of the useful signal and sometimes even exceed it.

Hence, for the processing of such signals, a more sophisticated analogue to digital conversion is required, which adds complexity to the device and may increase costs or space.

SUMMARY

Embodiments and examples presented herein provide a solution to such challenges. Undesired signal fractions may be present irrespective of the presence of the actual desired signal. This means that a desired signal may also contain ambient light and noise. Such undesirable fractions may be canceled in the analogue domain by sampling the undesired fraction and subsequently removing the undesired fraction during an acquisition of the desired signal, i.e. the signal to be measured.

In an aspect, a device may cancel undesired fractions from a detected signal. The device may include a first region having an output node and including a light sensitive sensor configured to detect a first signal, and an analogue to digital converter coupled to the output node and a second region. A second region of the device may be selectably coupled to the first region based on a first control signal. The second region may include a storage device to store a signal based on the detected signal.

Finally, the second region may include an output node coupled to the sensor. During detection of a second signal, the second region is configured to provide a compensation signal to the light sensitive sensor based on the stored signal.

The device may measure undesired signal fractions and store the undesired signal fractions (or a signal corresponding to it) in the storage device. During a subsequent acquisition phase, the stored signal may be used to cancel the undesired signal fractions, which then leaves only the useful and desired signal behind.

In some aspects, the light sensitive sensor may detect the first signal based on the first control signal, and to detect the second signal based on a second control signal. The second control signal may be after the first signal.

In an aspect, the first region and the second region are coupled together via a current mirror having a mirroring transistor and a mirror transistor. The mirroring transistor may be arranged in the first region, and the mirror transistor may be arranged in the second region. The mirroring transistor and the mirror transistor in this sense are not necessarily a single transistor but may also include a plurality of transistors or a transistor array or any other element that is capable of mirroring a current on an input side, i.e. the mirroring side, to an output side, i.e. the mirror side.

In an aspect, a gate terminal of the mirroring transistor and the mirror transistor are coupled together via a first switch configured to respond to the first control signal. In regards to the above, the mirroring transistor may include a gate coupled to its output. The mirroring transistor may form a reference as the current through this transistor is fixed and mirrored into the mirror transistor.

In an aspect, the storage device may include a capacitor connected between a control terminal of the mirror transistor and a reference or supply terminal.

In another aspect, different currents may be required in the second region as compared to the current(s) of the first region. For this purpose, the mirror transistor may also include a plurality of parallel-arranged transistors, such as at least some of the plurality of switchable transistors arranged in the second region. In some embodiments, each transistor may include a length and a width where at least one of the length and the width of a first transistor is different from a second transistor of the plurality of parallel-arranged transistors.

In an aspect, the second region may include an actuator to adjust a current through the output node of the second region based on the stored signal. The actuator may include a differential amplifier or a comparator. In aspects, the actuator may include a first input coupled to the storage device and a second input coupled to the second region. The comparator may be configured to adjust the output current based on a comparison of a measurement of the stored signal and a measurement of the current through the second region.

In some aspects, the output node is arranged between the mirroring transistor and the light sensitive sensor. In some aspects, the second region further includes a second switch configured to connect the second region to a terminal for a ground potential based on the first control signal and a third switch configured to connect the second region to the light sensitive sensor based on a second control signal after the first control signal.

In some aspects, the first region includes a fourth switch between the output node and the analogue to digital converter. The fourth switch may switchably connect the analogue to digital converter to the output node based on the second control signal.

The light sensitive sensor may be a photodiode or a photo resistor or any other device capable of detecting light. The light sensitive sensor may convert the light into a current or voltage signal, i.e. a primary or first signal.

A light sensitive sensor may include the above-mentioned device for cancelling ambient light and noise fractions, such as a photo-diode. The sensor may also include a light generating device configured to generate light to be reflected from an object and received by the device.

A method for cancelling undesired signal fractions in a measured signal may include obtaining a first signal during a first time period by a sensor, such as a light sensitive sensor. The first signal may include undesired signal fractions, such as ambient light fractions and noise fractions. During the first time period, the first signal may be transformed into a storage signal and then stored, for example by a capacitor. Then, a cancellation signal may be generated based on the storage signal during a second time period where the second time period occurs after the first time period. During the second time period, the cancellation signal is applied to the sensor, and the sensor may obtain a second signal. The second signal may include a desired fraction and the undesired signal fraction. A third signal may be applied to an input of an analogue to digital converter where the third signal is the difference between the first signal and the second signal.

Using the method, undesired signal fractions in a first signal obtained by a sensor are sampled during a first phase or sample phase (e.g. first time period) and may be stored. During an acquisition phase (e.g. second time period), a cancellation signal may be generated from the stored signal and applied back to the sensor. During the acquisition phase, the sensor may obtain the desired and undesired signal fractions; the desired signal fractions may also be referred to as a primary signal. Based on the cancellation signal being applied back to the sensor, the sensor may provide an output signal that is the difference between the acquired signal and the cancellation signal, i.e. the third signal. The cancelation signal may correspond to the undesired signal fraction obtained during the sample phase.

In an aspect, the sensor may be configured to generate a current signal based on the first signal or the second signal. The storage signal may be a voltage signal based on the current signal, such as proportional to the current signal. Hence, the cancellation signal may also be generated as a current signal, and thus, two current signals may be subtracted from each other during the second time period (the acquisition phase), which leaves the desired signal fraction behind.

In some aspects, no signal is applied to the input of the analogue to digital converter during the first period.

BRIEF DESCRIPTION OF THE DRAWINGS

In the following, the proposed principle as well as several embodiments and examples are described in detail in connection with the accompanying drawings. In the figures, identical reference characters show identical features and functions.

DETAILED DESCRIPTION

The proposed principles disclosed herein may be used for various applications. Some of those are concerned with the field of optical sensing such as proximity sensing, photoplethysmogram, LIDAR, time of flight and variances thereof. However any instance in which a signal to be measured includes a relatively large noise or undesired signal fraction may be possible.

The actual signal or the fraction of the detected signal to be measured and evaluated may be referred to as a primary signal or desired signal. In practice, a detected and measured signal may contain, apart from the primary signal, undesired signal fractions. These undesired signal fractions may have various origins. An undesired signal fraction may contain noise as further explained below. In embodiments, in which a light signal is to be measured, undesired signal fractions may contain ambient light. Ambient light may superimpose with the primary signal when measured. As a result, a signal to noise ratio may deteriorate, which increases potential measurement error.

Figure 1:
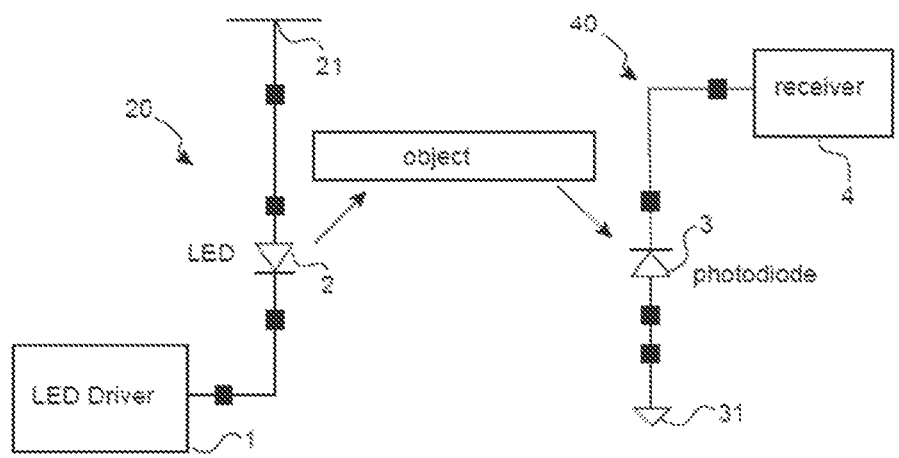
FIG. 1 shows an arrangement for measuring light reflected from an object.

FIG. 1 illustrates a non-limiting arrangement. The arrangement may include a light emitting diode driver 1, which is coupled to a light source 2, such as a light emitting diode LED. Light source 2 is part of a region between light source driver 1 and supply voltage terminal 21. The illustrated region, including driver 1 forms the transmission side 20 of the arrangement. Alternatively, the light source 2 may include a laser, an arrangement of several diodes or lasers and the like. The receiver side 40 includes a receiver 4 for evaluating a signal provided by the photo diode or more generally a light sensitive sensor 3. The diode 3 is arranged in a respective region between ground potential terminal 31 and a receiver 4. It may be understood that while in the following, the light source may be implemented as a LED and the light sensitive sensor may be implemented as a photo diode, the invention is not limited to those embodiments or examples. One may use any kind of light sensitive sensor, including but not limited to a photo diode, an IR sensor, a photo sensor, a photo resist, and the like.

In operation, the light source 2 may illuminate an object to be evaluated for a short period. During this period, the object may reflect a fraction of the light towards the light sensitive sensor 3. The reflected light from the object is sensed by light sensitive sensor 3 and provided to the receiver 4 for further evaluation. A typical application is related to LIDAR, which utilizes the time of flight. In LIDAR applications, the delay time when the beam of light is emitted and reflected back from the object is measured. The distance is then calculated from the speed of light.

In non-limiting embodiments, the light sensitive sensor 3 may sense light reflected from the object and also undesired ambient light, and other undesired fractions along with the signal. As used herein, the actual signal, or the fraction of the detected signal, to be measured and evaluated (the one originating from the light source and reflected by the object) may be referred to as the primary or desired signal.

The fraction of detected signal caused by ambient light is referred to as an ambient light fraction. In addition, several other undesired signal fractions may be sensed by the photo diode including thermal noise and flicker noise. While thermal noise is a function of temperature, flicker noise is a type of electronic noise with a power spectral density proportional to 1/f. It is therefore often also referred to as pink noise and occurs in almost all electronic devices, including light sensitive sensors. "Noise" is defined herein to include thermal and flicker noise and all other undesired signal fractions are generally referred to as noise.

While the flicker and thermal noise fractions are often in the range of the primary signal, and may be somewhat compensated, the ambient light may vary during daytime and may be dependent from the position or location of the light sensitive diode. In certain embodiments, the ambient light fraction (particularly in daylight) may be orders of magnitude larger than the primary signal itself. Hence, it is important to remove the ambient light from the overall detected signal, being the sum of the ambient light, the primary signal as well as various noise fractions to preserve the primary signal integrity.

Apart from the unfavourable signal/noise ratio, a large fraction of ambient light may cause the receiver to saturate due to the excessive photo current by the light sensitive sensor. This may significantly reduce the resolution of the primary signal, the measurement may become useless, or at least significantly distorted.

An approach to remove the undesired fractions from the detected signal is achieved by measuring the ambient light and any noise fraction without the primary signal first, and then subsequently measuring the primary signal in combination with the ambient light and noise. For example in time of flight applications, the undesired fractions are cancelled, by measuring the ambient light and noise during a first period and then illuminating the object and measuring again. The first signal is then simply subtracted from the second signal assuming that during the first measurement and second measurement the undesired signal fractions are substantially constant.

Figure 6:
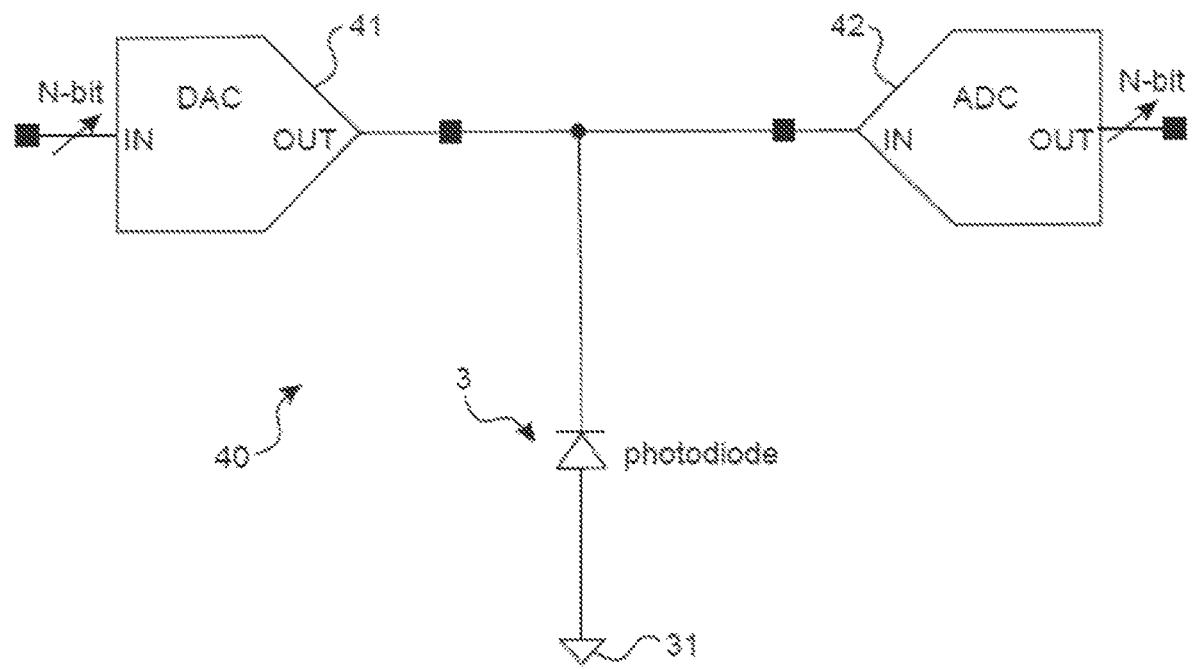
FIG. 6 shows an approach for cancelling undesired signal fractions.

For this purpose, a receiver is illustrated in FIG. 6. The photodiode may measure the ambient light with any noise and provide its signal to the analogue digital converter (ADC) 42, which converts the signal into an N-bit digital word. The digital word may be applied to the DAC converter, which transforms the digital word into a voltage or current signal provided to the photodiode when detecting the primary signal. The converted digital word from a digital analogue converter (DAC) 41 may cancel the ambient light current by providing a respective signal to the light sensitive sensor and photodiode, respectively. In effect, the converted digital word may cancel the ambient light during the measurement to where only the primary signal is converted by the ADC 42.

In some embodiments, the ambient light current may reach several μA or even several mA. For example, a peripheral capillary oxygen saturation (SP02) measurement requires a signal-to-noise ratio in the range of 85 dB. Consequently, the remainder of the signal applied to the analogue to digital converter is relatively small, requiring a converter with a very high resolution. In the above given example, the resolution of an ADC must be in the range of 15 to 20 bits. A similar requirement may be given for the DAC. Furthermore, post-processing may require a more complex algorithm to separate the useful fraction of the signal from the ambient fraction. Both aspects may increase the complexity for such designs.

Ambient light and noise may be subtracted from the detected signal without the need of a DAC and without sampling the undesired fractions in an ADC. The above-mentioned method may reduce the complexity of the design, as an analogue digital converter is configured to receive a pre-processed signal with the ambient light and noise fraction subtracted from the detected signal. In other words, the ambient light and noise fractions have already been removed.

Figure 2:
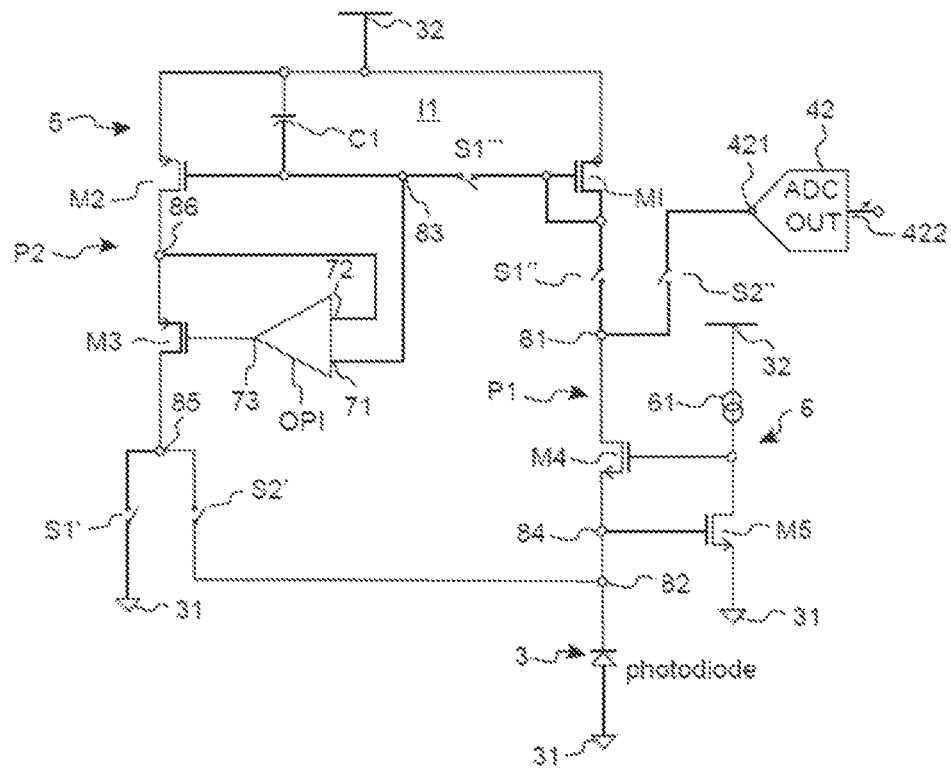
FIG. 2 illustrates an example circuit of the device configured to perform a cancellation of the undesired fractions in the detected signal.

FIG. 2 illustrates an example circuit of such a device, performing a cancellation of the undesired fractions in the detected signal. The device is arranged between the output 82 of a photodiode 3 and an input 421 of an ADC 42. ADC 42 has a high resolution in this non-limiting arrangement. The arrangement may include a first region P1, in which photodiode 3 is arranged, and a second path P2 configured for the detection of the undesired fractions and the subsequent cancellation of those fractions. The first path P1 includes a photo diode 3 coupled between ground terminal 31 and node 82. Node 82 is connected to a transistor M4 and also to the gate of transistor M5.

Transistor M4 and transistor M5 are part of a current source six, providing a bias current through a photo diode 3. Current source 6 includes constant source 61 arranged together with transistor M5 between ground terminal 31 and supply terminal 32. A node between transistor M5 and current source 61 is connected to the gate terminal of transistor M4. In subsequent operation, current source 6 may bias the current through the photodiode 3 by adjusting the gate voltage on transistor M4 based on the voltage at the node between the constant source 61 and transistor M5. Its gate receives the signal at node 84 corresponding to the voltage drop across the photodiode 3.

First region P1 may include node 81 arranged between the drain side of transistor M4 and switch S1". Node 81 is connected to input 421 of the analogue digital converter 42 via switch S2". Switch S1" is coupled to current mirroring transistor M1 and particular to its source terminal as well as to its gate terminal. The drain terminal of transistor M1 is connected directly to the supply terminal 32.

Current mirroring transistor M1 is part of the current mirror, which connects the first path P1 to a second path P2. For this purpose, the current mirror includes current mirroring transistor M1 with its gate connected to its source terminal and switch S1''', as well as mirror transistor M2. Switch S1''' is arranged between the gate terminals of transistors M1 and M2, respectively. Furthermore, the gate of mirror transistor M2 is connected via capacitor C1 to the supply potential terminal 32.

Path P2 also includes a control transistor M3 arranged downstream to mirror transistor M2 and particular between transistor M2 and node 85. Two switches S1' and S2' are coupled together to node 85 that connects to the source terminal of transistor M3. While switch S1' is arranged between the ground potential terminal 31 and node 85, switch S2' couples node 85 with node 82 and photodiode 3. For controlling a current through the second path P2, an operational amplifier OP1 is also provided. Operational amplifier OP1 is connected with its output 73 to the gate of transistor M3, and with its noninverting input 71 to node 83 between switch S1" and the gate of transistor M2. The inverting input 71 of OP1 is coupled to node 86 between transistors M3 and M2, respectively. Operational amplifier OP1 may sense the voltage at node 83 and adjust the gate of the terminal M3 such that the voltage at node 86 may be equal to the voltage at node 83.

Figure 3:
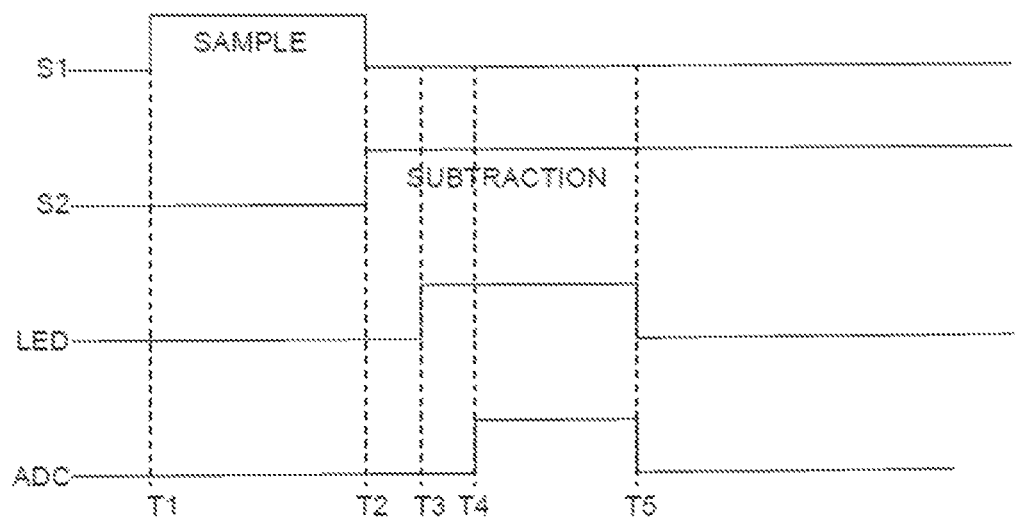
FIG. 3 shows a time signal diagram for cancelling undesired signals.

The operation of the device according to FIG. 2 is also explained with respect to the various signals in FIG. 3. The proposed sample and subtraction method is relatively simple and it uses a less complex arrangement. The ambient light and noise fractions assembled during a first period T1 to T2 is stored and then removed during the second period from T3 to T5, thus leaving substantially the actual primary signal behind. The benefit of the sampling phase lies in the fact that ambient light is detected and measured, and also any noise fraction generated in the photodiode. Likewise, these fractions of undesired signals are removed from the overall detected signal during the measurement phase.

Switches S1 and switches S2 are controlled by respective control signals. Particularly switches S1 are controlled by a first control signal, referred to in FIG. 3 as S1. Likewise, switches S2 are controlled by a second control signal referred to as S2 in FIG. 3. One or more processors (not shown) may provide the first control signal and the second control signal to the device. For example, the light source driver 1 may provide the first control signal and the second control signal in a non-limiting embodiment.

During the sampling phase from T1 to T2 in FIG. 3, switches S1 are all closed (for the purpose of this explanation switches S1 include S1', S1" and S1'") while switches S2 (including S2', S2" and S2'") are open, controlled by the level of the respective first and second control signals. Photodiode 3 in this state of the device is then connected directly to transistor M1 via switch S1" and disconnected from the input of ADC 42. The ambient light in combination with noise from the photodiode and any other electronic component in path P1 is sensed by the photodiode, causing a current flowing through the first path P1 and through transistor M1. Hence, the strength of the current through path P1 is mainly depending on the ambient light and the noise.

Due to the connection between the source terminal and the gate terminal of transistor M1, and closed switch S1'", the voltage at source terminal of transistor M1 may also be sampled into capacitor C1. In addition, the voltage at source terminal M1 is mirrored onto the gate of transistor M2 causing transistor M2 to become conductive in the same manner as transistor M1 (assuming that M1 and M2 include the same or similar geometric parameter). Operational amplifier OP1 may sense the voltage at node 86 as well as terminal 83. It provides an output signal to the gate of transistor M3 adjusting its gate such that the voltage at node 86 corresponds to the voltage at node 83 and thus at the source terminal of transistor M1. (For the sake of clarity, the source terminal is the terminal adjacent to S1").

After time T2, the switches S1 are opened, and switches S2 are closed. This may terminate the sampling phase. The previous voltage across the source terminal of M1 is now stored in capacitor C1. In the subsequent measurement phase, the voltage across capacitor C1 is now applied directly to the gate of transistor M2 and to the non-inverting input 71 of the operational amplifier OP1. Consequently, transistor M2 continues to act as a current mirror transistor with the region P2, as if before, providing a current through bias transistor M3 to node 85, switch S2 and the photo diode 3 at terminal 82.

Hence, the current applied to photodiode 3 is given by the current through transistors M2 and M3 with their gates receiving a signal corresponding to the one during the sampling phase. The signal corresponds to the voltage at source terminal of transistor M1 in the sampling phase. The output signal provided by operational amplifier OP1 for transistor M3 may maintain regulation during the measurement phase such that the operating condition of path P2 matches the condition of transistor M1 during the sample phase.

The resulting current is now applied to the photodiode for ambient light and noise cancellation. At time T3 a short while after the closing of switches S2 (to become stable), light source LED is activated. Photodiode 3 now detects the ambient light, noise fractions and the primary signal. While the ambient light fraction and the noise fraction is now cancelled out by the current from path P2 into diode 3, the reflected light of the object is detected as a primary signal and applied as a remaining signal via node 81 and closed switch S2 to the input 421 of the analogue to digital converter 42. The ADC output 422 may include a digital output word.

As illustrated in FIG. 3, ADC 42 may sample the primary signal starting at T4 to T5. Similar to the above, T4 is slightly delayed to give enough time to reach certain stability for the detected signal. The delay may improve signal quality. Due to the cancellation, ADC 42 may receive and convert a stable primary signal into a digital word representing the signal value.

In some embodiments, the primary signal may contain an AC fraction, and also a DC fraction. In some embodiments, the DC fraction may be significantly larger than the AC fraction, but relatively minimal. Hence, it might be a desire to cancel ambient light and noise fraction, and also the DC part of the primary signal, which leaves only the AC fraction of the primary signal to be converted. An example of this might be for a heart rate measurement, in which the reflected signal from the skin contains about 95% of the DC fraction and only 5% of an AC fraction. However, only the AC component is needed to extract the heart rate or provide any information. That means apart from the ambient light and noise fraction, the DC component needs to be removed as well. Similar to the previous example, an advantage of cancellation of the DC component lies in the fact that the analogue to digital converter may be reduced in its resolution from about 19 bits to about 8 bits without sacrificing performance.

Figure 4:
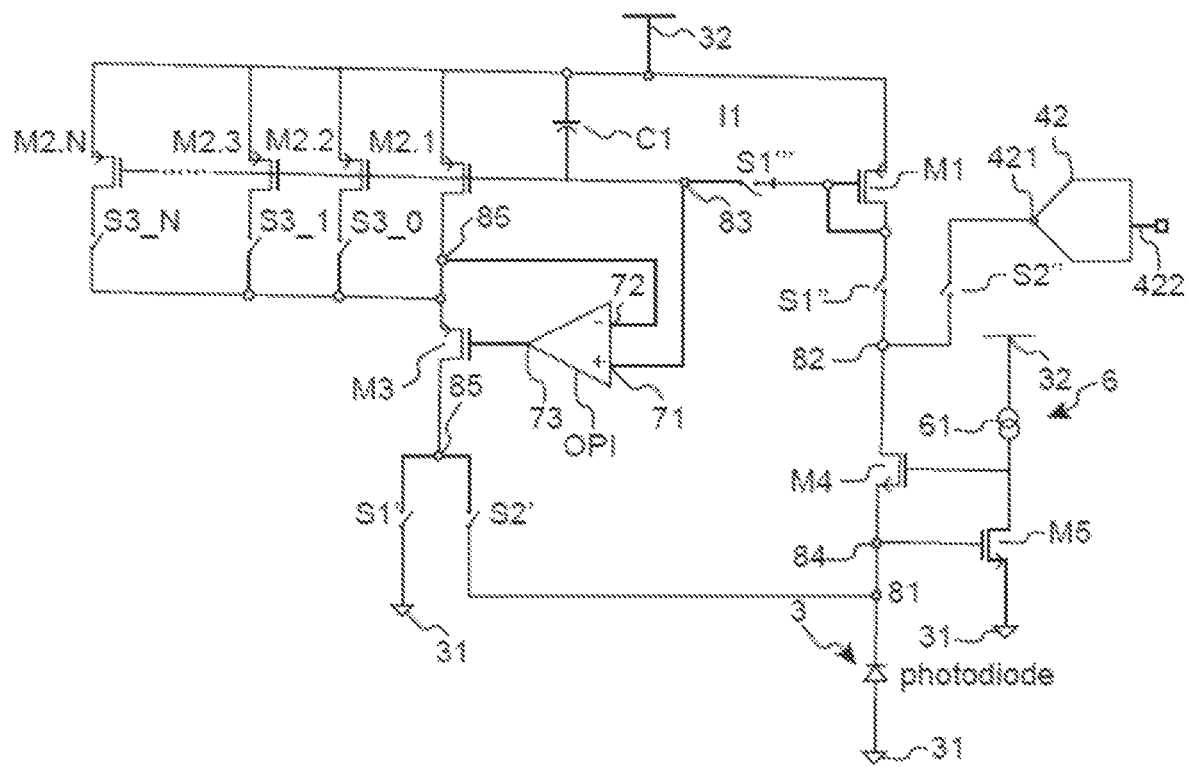
FIG. 4 illustrates a non-limiting embodiment of the device having a current mirror that includes a current mirror and a plurality of current mirroring transistors.

FIG. 4 illustrates a non-limiting embodiment where the transistor M2 contains a variable and selectable geometric dimension. For this purpose, the current mirror connecting the path of P1 and P2 together includes the current mirroring transistor M1 and several mirror transistors M2.1, M2.2 and M2.3 to M2.N. These second transistors M2 are arranged in an array. In one example, each of the transistors includes the same geometric parameter. Apart from the first mirror transistor M2.1, each of the transistors M2.2, M2.3 to M2.N are connected via a switch S3_0, S3_1 to S3_N to node 86 and with their respective drain terminals to the supply terminal 32. The switches S3_0, S3_1 to S3_N are individually selectable, such that the mirror current may now be freely adjusted.

In one example, each of the transistors includes the same geometric parameter. In such embodiment, as presented in FIG. 4, the geometric dimension of each transistor M2, that is the width and the length of the respective channel of each of transistors M2.1, M2.2, M2.3 to M2.N is equal. Consequently, each transistor may add the same current through transistor M3. By switching the respective switches S3, the mirror current is increased or decreased by the same amount.

In an alternative embodiment, the geometric dimension of the respective transistors M2.1, M2.2, M2.3 to M2.N may vary for example and the width of the channel for each of the transistors or the respective length may increase by a factor of two. Such arrangement corresponds to a binary setup of the arrangement of the mirror transistors as illustrated in FIG. 6, thereby generating our DC component in a binary fashion. So for example, transistor M2.2 includes the same geometric parameters as transistor M2.1, while M2.3 has a channel width twice as large as transistors M2.2 and M2.1. The maximum overall current for these three transistors, when all switches are closed would then be $I_{total} = I_{M2.1} + I_{M2.2} + I_{M2.2} = 4\ I_{M2.1}$.

Figure 5:
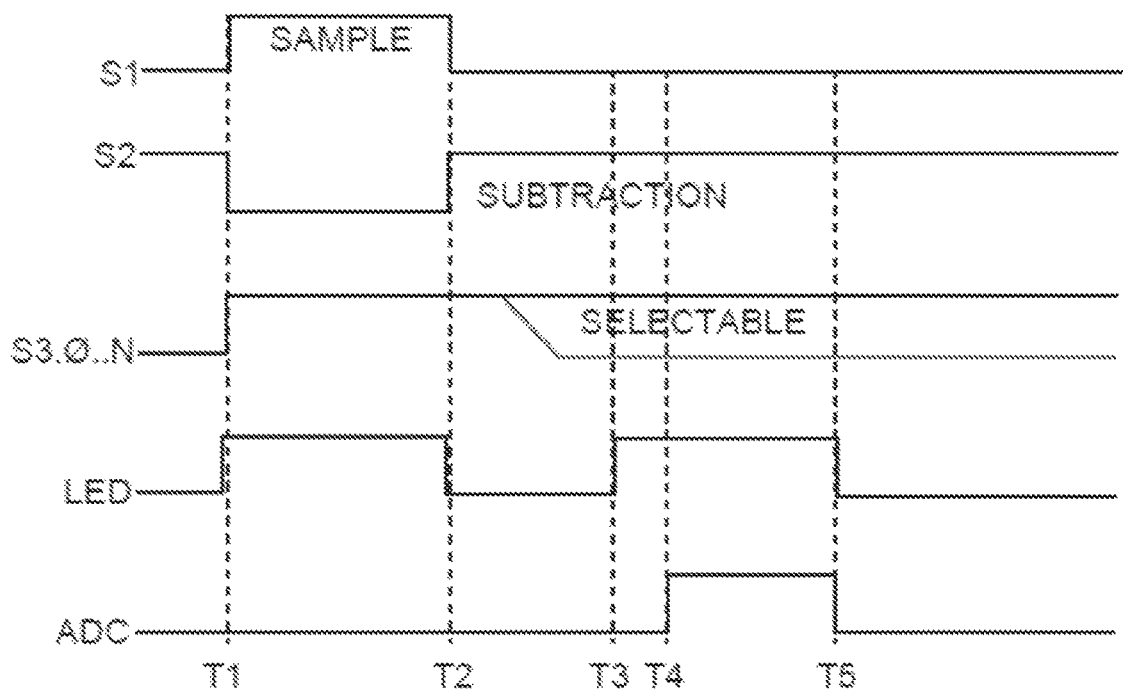
FIG. 5 shows a time signal diagram for the various switches during a sample phase and then a measurement phase.

FIG. 5 illustrates the time signal of the first control signal (referred to in line labelled S1) and the second control signal (referred to in line labelled S2) for the various switches during the sample phase and the subsequent measurement phase. During sample phase between time T1 and T2, switches S1 and S3 are closed, and switch S2 is open. The light diode or light source is switched on and the object illuminated. Consequently, the object provides DC and AC component, which is reflected back to the photo diode and measured together with any other undesired signal fraction, like ambient light or noise.

As explained in the previous section, the operational amplifier OP1 provides an output signal at its terminal 73 to the gate of transistor M3, ensuring that during the sample phase, the drain voltage at node 86 is equal to the voltage at node 83 corresponding to the source voltage of current mirror transistor M1. During that sample phase, the photo-diode 3 samples the DC and AC component as well as the ambient light and noise fractions. It should be noted in this regard that during the sample phase, photodiode 3 also detects the AC fraction. However, the AC fraction is relatively small compared to the DC fraction. Hence, the voltage component at source terminal of current mirroring transistor M1, caused by the AC component is significantly smaller than the combined DC component of the ambient light and any noise fraction. The error introduced by measuring the AC component is small such that in the later subsequent measurement phase, there may not be a significant reduction of the resolution or signal quality.

During the sample phase, the current through path P2 is relatively large, as each of the switches S3 are closed, thereby providing a maximum current through the respective transistors. In the subsequent measurement phase, as switches S1 are opened and switches S2 are closed, switches S3 may be selectively opened or closed. Again, the light source or light emitting diode may illuminate the object again, and the reflected light is sensed by the photodiode 3. The signal by the photo-diode is compensated with the current provided by the second path and forwarded to the ADC 42. The analogue to digital converter is activated to sample the pre-processed signal and convert it into the digital word representing the AC fraction of the signal detected by the photodiode.

What is claimed is:

1. A device for cancelling undesired fractions in a detected signal comprising:
   a first region having an output node; wherein the first region includes a light sensitive sensor; wherein the light sensitive sensor is configured to detect one or more signals;
   an analogue to digital converter coupled to the output node;
   a second region switchably coupled to the first region based on a first control signal; wherein the second region comprises a storage device configured to store a signal based on the detection of a first signal of the one or more signals;
   wherein the second region comprises an output node coupled to the light sensitive sensor; and wherein the second region is configured to provide a compensation signal based on the stored signal to the light sensitive sensor during detection of a second signal.

2. The device according to claim 1, wherein the first region and the second region are coupled via a current mirror; wherein the current mirror comprises a mirroring transistor and a mirror transistor, wherein the mirroring transistor is arranged in the first region, and wherein the mirror transistor is arranged in the second region.

3. The device according to claim 2, wherein the gate terminals of the mirroring transistor and the mirror transistor are coupled via a first switch configured to be responsive to the first control signal.

4. The device according to claim 2, wherein the storage device comprises a capacitor connected between a control terminal of the mirror transistor and a reference or supply terminal.

5. The device according to claim 2, wherein the mirror transistor comprises a plurality of parallel-arranged transistors, wherein at least a portion of the plurality of transistors are switchably arranged in the second region.

6. The device according to claim 5, wherein each transistor of the plurality of transistors comprises a length and a width, wherein a length and a width of a first transistor of the plurality of transistors is different from a length and a width of a second transistor of the plurality of transistors.

7. The device according to claim 1, wherein the second region comprises an actuator configured to adjust a current through the output node of the second region based on the stored signal in the storage device.

8. The device according to claim 7, wherein the actuator comprises a comparator having a first input coupled to the storage device and a second input coupled to the second region, wherein the comparator is configured to adjust the output current based on a comparison of a stored signal measurement and a current measurement through the second region.

9. The device according to claim 2, wherein the output node is arranged between the mirroring transistor and the light sensitive sensor.

10. The device according to claim 1, wherein the second region further comprises:
    a second switch configured to connect the second region to a ground potential terminal based on the first control signal;
    a third switch configured to connect the second region to the light sensitive sensor based on a second control signal.

11. The device according to claim 1, wherein the light sensitive sensor is configured to detect the first signal based on the first control signal and configured to detect the second signal based on the second control signal.

12. The device according to claim 1, wherein the first region comprises a fourth switch arranged between the output node and the analogue to digital converter; wherein the fourth switch switchably connects the analogue to digital converter to the output node based on the second control signal.

13. The device according to claim 1, wherein the light sensitive sensor is a photodiode.

14. A system comprising:
    a light generating device configured to generate light to be reflected from an object; and
    the device according to claim 1 configured to receive the reflected light from the object.

* * * * *